United States Patent

[11] 3,621,453

[72] Inventors Carl G. Ringwall
Scotia;
Salvatore Bottone, Jr., Schenectady, both of N.Y.

[21] Appl. No. 834,840
[22] Filed June 19, 1969
[45] Patented Nov. 16, 1971
[73] Assignee General Electric Company

[54] ELECTROFLUIDIC DELAY LINE OSCILLATOR
10 Claims, 3 Drawing Figs.

[52] U.S. Cl. .......... 331/64, 73/339 A, 331/66, 331/155, 331/162
[51] Int. Cl. .......... H03b 5/34
[50] Field of Search .......... 331/64–66, 154, 155, 162; 73/339 A

[56] References Cited

UNITED STATES PATENTS

| | | | |
|---|---|---|---|
| 1,921,501 | 8/1933 | Bower .......... | 331/155 |
| 2,949,166 | 8/1960 | Coleman et al. .......... | 331/155 X |
| 3,186,226 | 6/1965 | Milnes et al. .......... | 73/339 |
| 3,214,976 | 11/1965 | Miller .......... | 73/339 |
| 3,318,152 | 5/1967 | Thompson et al. .......... | 73/339 X |

FOREIGN PATENTS

| | | | |
|---|---|---|---|
| 171,988 | 8/1922 | Great Britain .......... | 331/154 |

*Primary Examiner*—Roy Lake
*Assistant Examiner*—James B. Mullins
*Attorneys*—David M. Schiller, Arthur E. Fournier, Jr., Frank L. Neuhauser, Oscar B. Waddell and Joseph B. Forman

ABSTRACT: A closed loop oscillator circuit consists of a tubing of predetermined length, an electrical-to-pneumatic transducer, a pneumatic-to-electrical transducer and an electronic amplifier. The electrical-to-pneumatic transducer converts an electrical frequency signal to a pneumatic frequency signal which generates pressure waves in a gaseous medium within the tubing. The tube length corresponds to one or multiple half-wavelengths of a reference frequency of oscillation. The electronic amplifier provides sufficient gain to maintain self-sustained oscillation in the closed loop circuit. The temperature or gas content (ratio) of the gaseous medium within the tubing can be determined from the actual oscillation frequency in the circuit.

Inventors:
Carl G. Ringwall,
Salvatore Bottone, Jr.
by Louis A. Moucha

ELECTROFLUIDIC DELAY LINE OSCILLATOR

Our invention relates to an oscillator circuit, and in particular, to an electrofluidic oscillator employing a tubing as a delay line of predetermined length corresponding to one or multiple half-wavelengths of a reference frequency of oscillation. The invention herein described was made in the course of or under a contract or subcontract thereunder, with the Department of the Navy.

Fluid oscillator circuits are employed in many fluidic control systems for purposes such as generating pressurized fluid pulsations of fixed and variable frequency corresponding respectively to the reference and actual value of a system parameter being controlled. Oscillators which are all-fluidic (i.e., utilize fluid amplifiers having no moving mechanical parts) are known and have many useful applications; however, such conventional all-fluidic oscillators are generally not suitable in gas-monitoring systems wherein the fluid amplifiers are supplied with a pressurized gas other than the gaseous medium being sensed. Thus, in an application wherein an all-fluidic oscillator is used to determine particular gas properties in a gas mixture, the introduction of a foreign gas via the fluid amplifier power fluid supply would result in a false indication of such properties.

Therefore, one of the principal objects of our invention is to provide a hybrid-type delay line oscillator.

Another object of our invention is to provide an electrofluidic delay oscillator adapted for determining particular properties of a gaseous medium.

A further object of our invention is to provide an electrofluidic delay line oscillator adapted for determining the gas content or temperature of a gas mixture of known gases.

Briefly summarized, our invention is an electrofluidic delay line oscillator which utilizes a tubing having a predetermined length corresponding to one or multiple half wavelengths of a particular or reference frequency of oscillation. The tubing is in a gaseous medium and is provided with an aperture located at each antinode of a reference frequency pneumatic pressure standing wave generated within the tubing, the aperture providing passage means through the tube wall for the gaseous medium. Suitable transducers and an electronic amplifier are connected in a closed loop circuit with the tubing, the amplifier providing sufficient gain to maintain self-sustained oscillation in the circuit. The circuit actual oscillation frequency is directly proportional to the gas constant or absolute temperature of the gaseous medium whereby the circuit may be utilized as a gas ratio or temperature sensor.

The features of our invention which we desire to protect herein are pointed out with particularity in the appended claims. The invention itself, however, both as to its organization and method of operation, together with further objects and advantages thereof, may best be understood by reference to the following description taken in connection with the accompanying drawings wherein:

Figures 1, 2, 3:
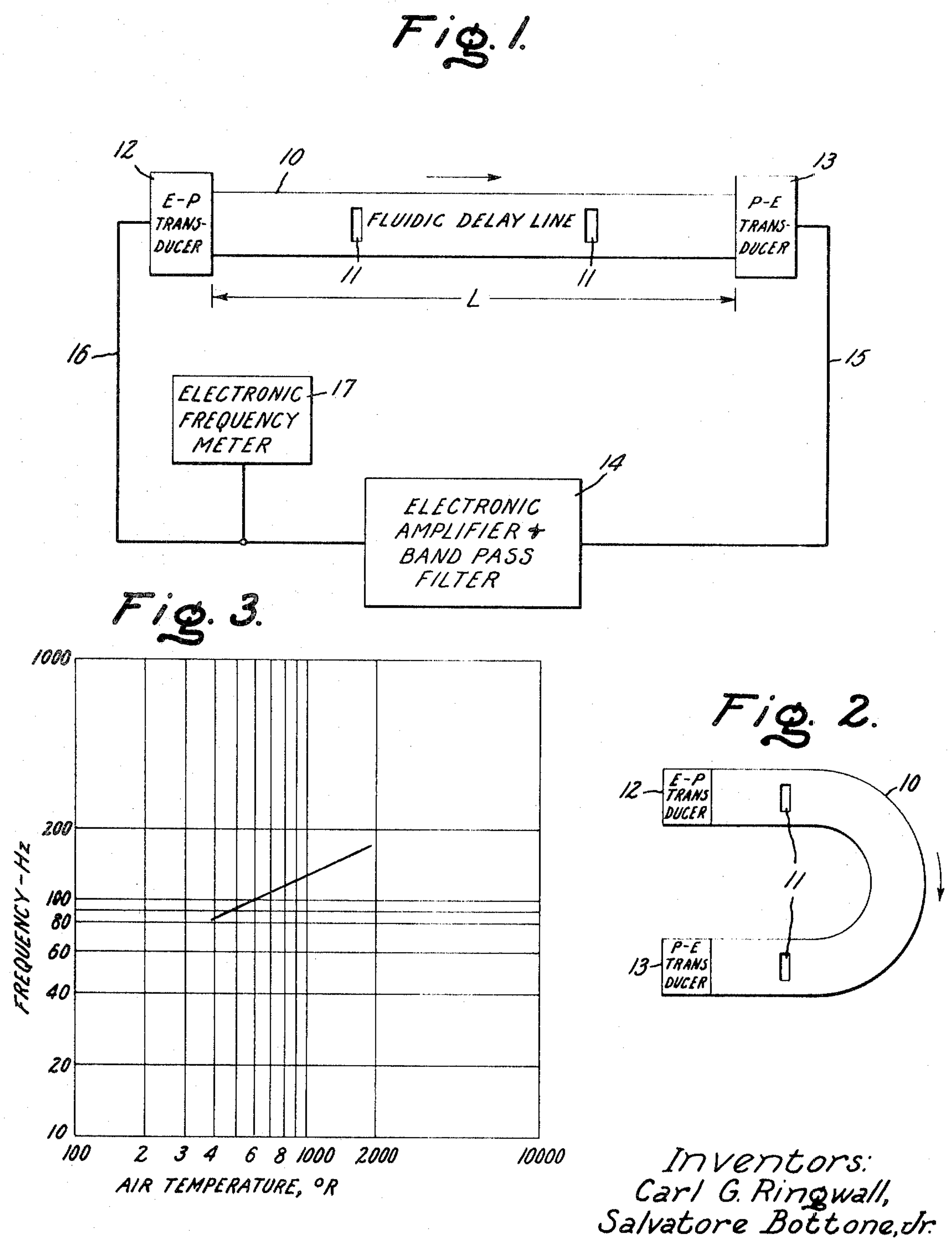
FIG. 1 is a block diagram of an electrofluidic delay line oscillator constructed in accordance with our invention.
FIG. 2 is a view of a second embodiment of the delay line transducer portion of the oscillator illustrated in FIG. 1.
FIG. 3 is a graphical representation of the oscillator frequency versus gas temperature characteristics of our electrofluidic delay line oscillator.

Referring now in particular to FIG. 1, there is shown our electrofluidic delay line oscillator in block diagram form. The delay line is a tubing 10 of predetermined length L corresponding of one or multiple half-wavelengths of a particular frequency of oscillation. The particular frequency may be described as a reference frequency corresponding to reference temperature and gas ratio conditions of a gaseous medium within the tubing. Tubing 10 is surrounded by the same gaseous medium that is within the tubing, and such gaseous medium is, in general, a mixture of two known, dissimilar gases. The dissimilarity in the gas constants R of the two gases is preferably of a high degree. Tubing 10 may be fabricated of any rigid material compatible with the gaseous medium employed such as plastic and metal. Tubing 10 may be a straight tube, as illustrated, or curved, the limitation being that no sharp bends be present. As one example of a curved embodiment, the tubing may be in a U-shaped form as shown in FIG. 2. The cross section of the tubing may be circular or noncircular. Tubing 10 is provided with an aperture 11 located at each antinode of a reference frequency pneumatic pressure standing wave which is generated within the tubing in a manner to be described hereinafter. The aperture 11 is the passage means through the tubing wall for passage of the gaseous medium into and from the tubing.

In the case of a single half wavelength standing wave (at reference frequency) generated within tubing 10, a single aperture 11 is located at the halfway point axially along the length of tubing 10. In the case of a two half-wavelength standing wave (again at reference frequency), two apertures 11 are located at the one-third points along tubing 10 corresponding to the standing wave antinodes, and are illustrated in FIG. 1. In like manner, for the case wherein the delay line length L corresponds to 3, 4, 5—*n* half-wavelengths at the reference frequency, apertures of number 3, 4, 5—*n* are located at the antinodes of the standing waves, respectively. The apertures 11 may be of virtually any shape, a rectangular shape with the narrow dimension along the longitudinal axis of the tubing being preferable since the area of such aperture may then be made sufficiently large for adequate passage of the gaseous medium through the tubing while assuring the edges of the aperture are located substantially at the antinode of the standing wave. As a typical example, the aperture dimension may be one-fourth by one-half of an inch.

A first end of tubing 10 is suitably connected to the output of an electrical-to-pneumatic transducer 12 and the second end of the tubing is connected to the input of a pneumatic-to-electrical transducer 13. The output of transducer 13 is connected to the input of a conventional electronic amplifier 14 and the output of the amplifier is connected to the input of transducer 12 by means of conventional electrical conductors 15 and 16, respectively, to complete a closed loop circuit which includes the delay line, transducers and amplifier. Transducer 12 converts an electrical frequency signal to a pneumatic pressure frequency signal of the same frequency. This pneumatic signal generates a pneumatic pressure wave in the gaseous medium within tubing 10, thereby forming the aforementioned pneumatic pressure standing wave therein. The tubing wall guides the pressure wave to transducer 13. When the operating frequency of our delay line oscillator corresponds to the reference frequency, the maximum amplitude points of the standing wave occur at the ends of the tubing 10 and the zero value point(s) occur at the antinode(s) 11. A change in the operating frequency from the reference value results in a shift of the standing wave maximum and zero amplitude points. Transducer 13 converts the pneumatic pressure frequency signal within tubing 10 back to an electrical frequency signal of the same frequency which is then amplified by electronic amplifier 14 having sufficient gain to maintain self-sustained oscillation in the closed loop circuit. Amplifier 14 preferably also includes a bandpass filter wherein the midband frequency thereof is tuned to the oscillator reference frequency to thereby determine the frequency mode (harmonic) of circuit oscillation.

The frequency of the pneumatic pressure oscillation in tubing 10 is:

$$f=n(\gamma RT)^{1/2}/2L$$

Wherein

R = equivalent gas constant of gaseous medium in tubing 10

$\gamma$ = equivalent specific heat ratio ($C_p/C_v$) of the gaseous medium

T = absolute temperature of the gaseous medium

*n* = an integer corresponding to the mode of oscillation which can have the values 1, 2, 3,—*n*. The lowest mode (*n* = 1) of frequency of oscillation operation of our delay line oscillator is obtained by having zero degrees phase shift in the electronic amplifier 14 whereby, assuming there is no phase shift in the transducers, the delay line 10 operates at one-half a wavelength of the reference frequency. Under these conditions, a pneumatic pressure wave is generated in tubing 10 (having one aperture 11) at the fundamental of the reference frequency and this pneumatic frequency signal is thence converted to an electrical frequency signal which is sufficiently amplified by amplifier 14 to drive transducer 12 for sustaining the pneumatic pressure frequency signal within tubing 10. The band-pass filter, if utilized, has a midband frequency equal to the reference frequency.

A suitable change (integer multiple) of the midband frequency in the band-pass filter and a corresponding selection of 180° (or multiples thereof) phase shift in amplifier obtains operation of our delay line oscillator in a desired mode ($n$ =2, 3,—$n$) which corresponds to harmonics of the $n$ =1 reference frequency and results in the corresponding multiple half-wavelengths of the pneumatic pressure standing wave in tubing 10. Obviously, tubing 10 must have appropriate location of apertures 11 when operating at a multiple half-wavelength standing wave.

The gain of amplifier 14 may be made sufficiently low to maintain self-sustained oscillation in the closed loop circuit without saturation of the amplifier or transducers and thereby obtain a substantially sinusoidal varying frequency signal in both pneumatic form in tubing 10 and electrical form in the circuit external of the tubing. Alternatively, the gain of amplifier 14 may be increased to obtain saturation of at least one of the components 12, 13 and 14, most commonly the amplifier 14, and thereby obtain a substantially squarewave signal having a repetition rate or frequency corresponding to the frequency hereinabove described. Thus, our delay line oscillator can provide sinusoidal (analog) or squarewave (digital) type frequency signals.

As a typical example of our delay line oscillator, the delay line 10 is fabricated of a one-half-inch inner diameter copper tube of 1-foot length (reference frequency =550 Hz. for air and mode $n$ =1 ) and the two transducers 12 and 13 are each of the piezoelectric type. Such piezoelectric-type transducers are probably the simplest type transducer that may be employed in our oscillator, although other conventional types may also be used. Thus, transducers 12 and 13 may also be of the electromagnetic type wherein transducer 12 is a conventional microphone and transducer 13 a conventional speaker. Transducer 12 may also be a capacitive-type microphone and transducer 13 an electrostatic-type speaker. Oscillation can be made to occur over a range of mode $n$=1 to $n$=9 by appropriately changing the midband frequency of the band-pass filter incorporated in the electronic amplifier component 14 and by utilizing one-foot copper tubing sections having the appropriately located apertures at the antinode points. No significant change in oscillator performance is observed due to a greater number of apertures at the higher modes of frequency operation.

Our delay line oscillation is adapted for utility as a gas ratio or gas temperature sensor since the gas constant R or temperature T ($\gamma$does not vary significantly) can be determined from the above frequency relationship $f$=$n$($\gamma$RT)$^{1/2}$/2L wherein frequency is dependent almost entirely on the delay line length L and what is often described as the acoustic velocity ($\gamma$RT) of the gas mixture. Thus, in a typical application of our oscillator, the tubing 10 and transducers 12 and 13, and often the entire closed loop system including amplifier-filter 14 are located in a gaseous medium being monitored. The reference frequency and corresponding length L of tubing 10 is selected from the above equation for a desired or reference value of gas constant R and gas temperature T. A conventional electronic frequency meter 17 is connected in the circuit. Preferably at the output of amplifier 14, for measuring the actual frequency of oscillation in the circuit. Thus, as the temperature of a single-gas or multigas mixture changes, or the gas ratio of a two-gas mixture changes (thereby changing the gas constant R thereof) the actual oscillator frequency (i.e., the circuit operating frequency) changes in accordance with the square root relationship indicated in the equation above.

FIG. 3 illustrates typical operating characteristics of our electrofluidic delay line oscillator. The gas medium being monitored is normal air. The graph is on a log-log scale and depicts the increase in oscillator operating frequency with increase in air temperature in degrees Rankine. The delay line length employed in obtaining the FIG. 3 characteristics was a 20 -foot length of one-fourth-inch diameter copper tubing.

It is apparent from the foregoing that our invention attains the objectives set forth in that it provides an electrofluidic delay line oscillator adapted for sensing a gas ratio (partial pressure of one gas) in a two-gas mixture, or for sensing the temperature of a multigas (two or more) mixture.

What we claim as new and desire to secure by letters patent of the United States is:

1. An electrofluidic delay line oscillator comprising tubing means having a predetermined length corresponding to one or multiple half-wavelengths of a reference frequency of oscillation, said tubing means disposed in a gaseous medium and provided with an aperture located at an antinode of a reference frequency pneumatic pressure standing wave which may be generated within said tubing means, the aperture providing passage means through the tubing wall for the gaseous medium, said aperture being of rectangular shape with the narrow dimension along the longitudinal axis of the tubing means, an electrical-to-pneumatic transducer connected at a first end of said tubing means for converting an electrical frequency signal to a pneumatic frequency signal which generates a pneumatic pressure wave within said tubing means, a pneumatic-to-electrical transducer connected at a second end of said tubing means for converting the pneumatic frequency signal to an electrical frequency signal, and an electronic amplifier having an input connected to the output of said pneumatic-to-electrical transducer and an output connected to the input of said electrical-to-pneumatic transducer for providing sufficient gain to maintain the frequency signal as a self-sustaned oscillation in the closed loop circuit including said tubing means, said transducers and said electronic amplifier, the frequency of oscillation being $$f=n\frac{(\gamma RT)^{1/2}}{2L}$$

where R is an equivalent gas constant of the gaseous medium, $\gamma$is an equivalent specific heat ratio $C_{P/}c_V$of the gaseous medium, T is the absolute temperature of the gaseous medium, L is the length of the tubing means and $n$ is an integer which can have the values 1, 2, 3,—$n$, the maximum amplitude points of the reference frequency standing wave occur at the ends of said tubing means and each antinode aperture being located axially along said tubing means spaced from the ends thereof, and said electronic amplifier including a band-pass filter wherein the midband frequency thereof corresponds to the reference frequency and determines the mode of oscillation in said tubing means corresponding to the value of the $n$ integer.

2. The delay line oscillator set forth in claim 1 and further comprising a frequency meter connected in the closed loop circuit for determining the actual frequency of oscillation therein and thereby determining the gas constant R when the absolute temperature T is known, or the absolute temperature T when the gas constant R is known.

3. The delay line oscillator set forth in claim 1 wherein said pneumatic-to-electrical transducer and said electrical-to-pneumatic transducer are each of the piezoelectric type.

4. The delay line oscillator set forth in claim 1 wherein said pneumatic-to-electrical transducer and said electrical-to-pneumatic transducer are each of the electromagnetic type.

5. The delay line oscillator set forth in claim 1 wherein said electronic amplifier provides a phase shift of 0° or multiples of 180° to insure circuit operation in a desired mode of oscillation at one or multiple half-wavelengths of the actual frequency of oscillation in the circuit corresponding to the value of the *n* integer.

6. The delay line oscillator set forth in claim 1 wherein said electronic amplifier is provided with a sufficiently high gain to maintain the self-sustained oscillation in the closed loop circuit and saturation of said amplifier to thereby obtain a substantially square-wave signal in said tubing means and the circuit external thereof and having a repetition rate equal to the oscillator frequency.

7. The delay line oscillator set forth in claim 1 wherein said electronic amplifier is provided with a sufficiently low gain to maintain the self-sustained oscillation in the closed loop circuit without saturation of said amplifier or transducers to thereby obtain a substantially sinusoidal varying frequency signal in said tubing means and the circuit external thereof.

8. The delay line oscillator set forth in claim 1 wherein said tubing means is a straight length of tube fabricated from a rigid material.

9. The delay line oscillator set forth in claim 1 wherein said tubing means is a curved length of tube fabricated from a rigid material.

10. The delay line oscillator set forth in claim 9 wherein the curved length of tube is in a U-shaped form.

* * * * *